(12) United States Patent
Chuang et al.

(10) Patent No.: US 9,673,194 B2
(45) Date of Patent: Jun. 6, 2017

(54) SEMICONDUCTOR ARRANGEMENT AND FORMATION THEREOF

(71) Applicant: TAIWAN SEMICONDUCTOR MANUFACTURING COMPANY LIMITED, Hsin-Chu (TW)

(72) Inventors: Harry-Hak-Lay Chuang, Singapore (SG); Wei Cheng Wu, Zhubei (TW); Shih-Chang Liu, Alian Township (TW); Ming Chyi Liu, Hsinchu (TW)

(73) Assignee: Taiwan Semiconductor Manufacturing Company Limited (TW)

(*) Notice: Subject to any disclaimer, the term of this patent is extended or adjusted under 35 U.S.C. 154(b) by 0 days.

(21) Appl. No.: 14/097,516

(22) Filed: Dec. 5, 2013

(65) Prior Publication Data

US 2015/0162329 A1  Jun. 11, 2015

Related U.S. Application Data

(60) Provisional application No. 61/898,243, filed on Oct. 31, 2013.

(51) Int. Cl.
| | | |
|---|---|---|
| H01L 27/088 | (2006.01) |
| H01L 21/265 | (2006.01) |
| H01L 21/8234 | (2006.01) |
| H01L 21/762 | (2006.01) |
| H01L 29/66 | (2006.01) |
| H01L 29/06 | (2006.01) |
| H01L 21/28 | (2006.01) |
| H01L 29/788 | (2006.01) |
| H01L 27/11521 | (2017.01) |

(52) U.S. Cl.
CPC ...... *H01L 27/088* (2013.01); *H01L 21/28273* (2013.01); *H01L 21/76224* (2013.01); *H01L 21/823418* (2013.01); *H01L 21/823481* (2013.01); *H01L 27/11521* (2013.01); *H01L 29/66825* (2013.01); *H01L 29/7883* (2013.01); *H01L 29/6656* (2013.01)

(58) Field of Classification Search
None
See application file for complete search history.

(56) References Cited

U.S. PATENT DOCUMENTS

| | | | | |
|---|---|---|---|---|
| 8,072,019 B2 * | 12/2011 | Park | ...... | H01L 27/115 257/315 |
| 2006/0255372 A1 * | 11/2006 | Patrick | ...... | H01L 27/14609 257/225 |
| 2013/0320452 A1 * | 12/2013 | Wann | ...... | H01L 21/82342 257/368 |

* cited by examiner

*Primary Examiner* — Robert Carpenter
(74) *Attorney, Agent, or Firm* — Cooper Legal Group LLC

(57) ABSTRACT

A semiconductor arrangement and method of forming the same are described. A semiconductor arrangement includes a first gate structure on a first side of an active area and a second gate structure on a second side of the active area, where the first gate structure and the second gate structure share the active area. A method of forming the semiconductor arraignment includes forming a deep implant of the active area before forming the first gate structure, and then forming a shallow implant of the active area. Forming the deep implant prior to forming the first gate structure alleviates the need for an etching process that degrades the first gate structure. The first gate structure thus has a desired configuration and is able to be formed closer to other gate structures to enhance device density.

20 Claims, 9 Drawing Sheets

SEMICONDUCTOR ARRANGEMENT AND FORMATION THEREOF

BACKGROUND

A semiconductor arrangement comprises one or more semiconductor devices. A transistor is one type of semiconductor device. Generally, a current flows through a channel of the transistor between a source and a drain of the transistor when a sufficient bias or voltage is applied to a gate of the transistor. The transistor is generally regarded as being in an "on state" when current is flowing through the channel and in an "off state" when current is not flowing through the channel.

DETAILED DESCRIPTION

Figure 1:
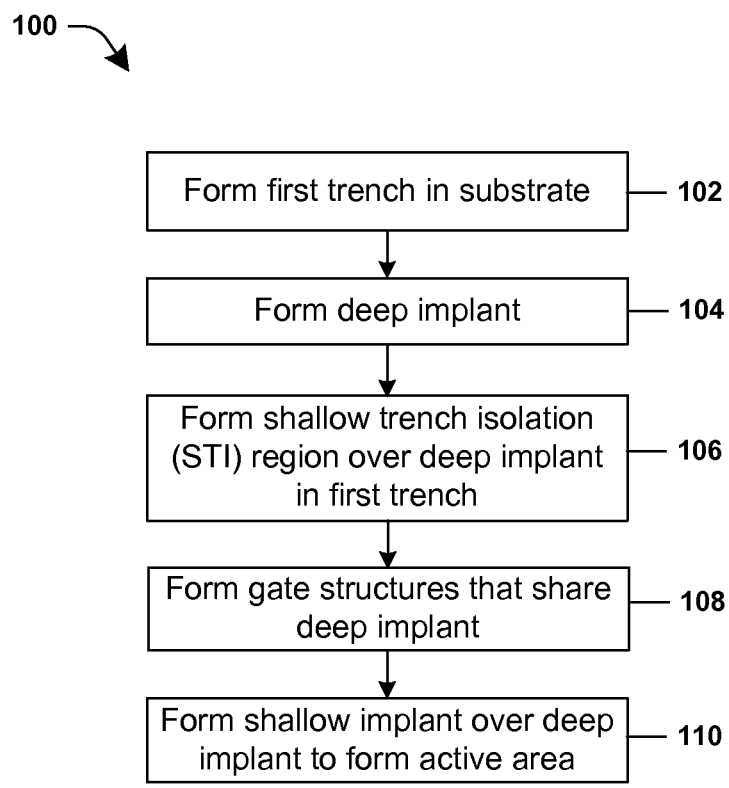
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

According to some embodiments, a method of forming a semiconductor arrangement comprises forming a first trench in a substrate and forming a deep implant in the first trench. In some embodiments, a first gate structure is formed on a first side of the deep implant and on a first side of the first trench and a second gate structure is formed on a second side of the deep implant and on the first side of the first trench. In some embodiments, a third gate structure is formed on the first side of the deep implant and on a second side of the first trench, and a fourth gate structure is formed on the second side of the deep implant and on the second side of the first trench. In some embodiments, a shallow trench isolation (STI) region is formed in the first trench. In some embodiments, a shallow implant is formed over the deep implant to form an active area. In some embodiments, the active area is at least one of a source or a drain. Forming the deep implant prior to forming the gate structures circumvents an etching process that degrades gate structures, according to some embodiments. Where the deep implant is formed after the gate structures are formed and thus the etching process is performed to form the deep implant, a distance between the first gate structure and the second gate structure is increased to mitigate the degradation to the gate structures. However, an area penalty is incurred by the increased distance. Because the etching process is not performed when the deep implant is formed prior to forming the gate structures, the distance between the first gate structure and the second gate structure is decreased. Forming the deep implant prior to forming the gate structures thus increases device density by allowing gate structures to be formed closer to one another while promoting desired gate structure configuration and performance by not exposing the gate structures to a potentially degrading etching process.

According to some embodiments, a semiconductor arrangement comprises a first gate structure on a first side of an active area and a second gate structure on a second side of the active area, the first gate structure and the second gate structure sharing the active region. According to some embodiments, the first gate structure comprises a first spacer on a first side of a first gate and a substantially identical second spacer on a second side of the first gate. According to some embodiments, the active area comprises at least one of a deep implant or a shallow implant. In some embodiments, a third gate structure is on the first side of the active area and a fourth gate structure is on the second side of the active area, such that the first gate structure, the second gate structure, the third gate structure and the fourth gate structure share the active area. In some embodiments, the active area is at least one of a source or a drain.

A method 100 of forming a semiconductor arrangement 200 according to some embodiments is illustrated in FIG. 1 and one or more structures formed thereby are illustrated in FIGS. 2-23. According to some embodiments, such as illustrated in FIG. 21, the semiconductor arrangement 200 comprises a first gate structure 228a on a first side 240a of an active area 249 and a second gate structure 228b on a second side 240b of the active area 249. According to some embodiments, the first gate structure 228a comprises a first spacer 230a on a first side 232a of a first gate 226a and a second spacer 230b on a second side 232b of the first gate 226a. According to some embodiments, a first spacer height 231a of the first spacer 230a is substantially equal to a second spacer height 231b of the second spacer 230b. According to some embodiments, one or more semiconductor arraignments 200 formed by method 100 have reduced area between adjacent gate structures, such as the first gate structure 228a and the second gate structures 228b, and comprise substantially symmetrical gate structures by avoiding etching to form a deep implant 208 of the active area 249. Moreover, forming the deep implant 208 without etching mitigates damage or degradation to gate structures otherwise incurred if etching is implemented to form the deep implant 208. The first spacer height 231a of the first spacer 230a being substantially equal to the second spacer height 231b of the second spacer 230b evidences a lack of damage to the first gate structure 228a and thus the formation of the first gate structure 228a after the deep implant 208 and the lack of etching to form the deep implant 208.

Figure 2:
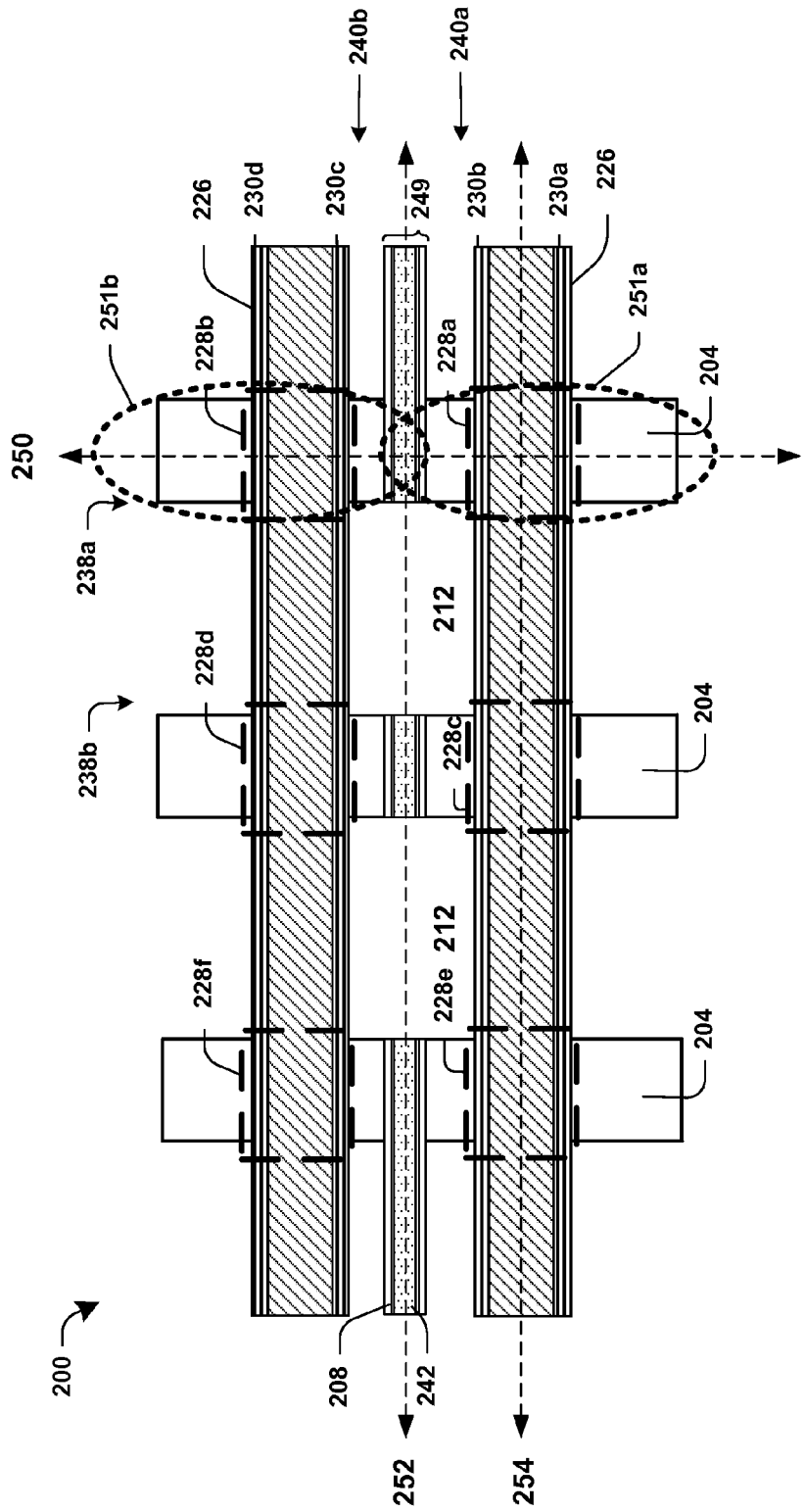
FIG. 2 is an illustration of a semiconductor arrangement, according to some embodiments.

Turning to FIG. 2 an overview or top down view of the semiconductor arrangement 200 is illustrated according to some embodiments, where a dielectric 246 illustrated in FIG. 21 is not shown in FIG. 2 so that features underlying the dielectric 246 are visible in FIG. 2. In FIG. 2 three lines 250, 252 and 254 are drawn to illustrate cross-sections that are depicted in other Figs. A first line 250 cuts through an OD region 204, the first gate structure 228a, and the second gate structure 228b, where the OD region 204 is a region where one or more active areas, such as at least one of a source or a drain, are formed in some embodiments. FIGS. 3, 6, 9, 12, 15, 18 and 21 are cross sectional views of the semiconductor arrangement 200 taken along the first line 250 at various stages of fabrication. A second line 252 cuts through the active area 249 and a STI region 212 over the active area 249. FIGS. 5, 8, 11, 14, 17, 20 and 23 are cross sectional views of the semiconductor arrangement 200 taken along the second line 252 at various stages of fabrication. A third line 254 cuts through the first gate structure 228a, a third gate structure 228c, and a fifth gate structure 228e. FIGS. 4, 7, 10, 13, 16, 19 and 22 are cross sectional views of the semiconductor arrangement 200 taken along the third line 254 at various stages of fabrication.

Figure 3:
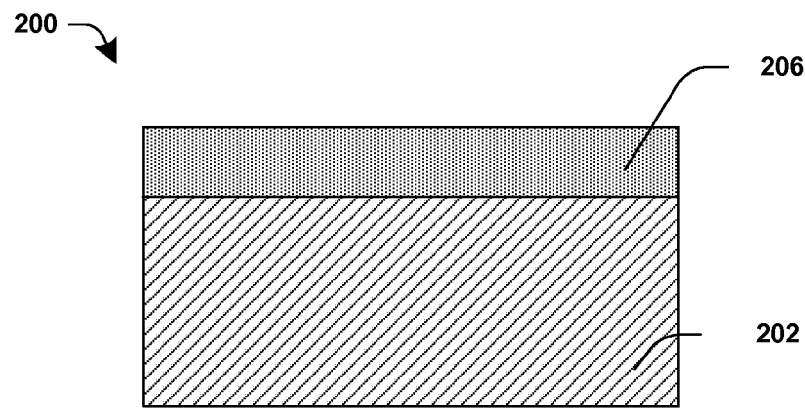
FIG. 3 is an illustration of a semiconductor arrangement, according to some embodiments.
Figure 4:
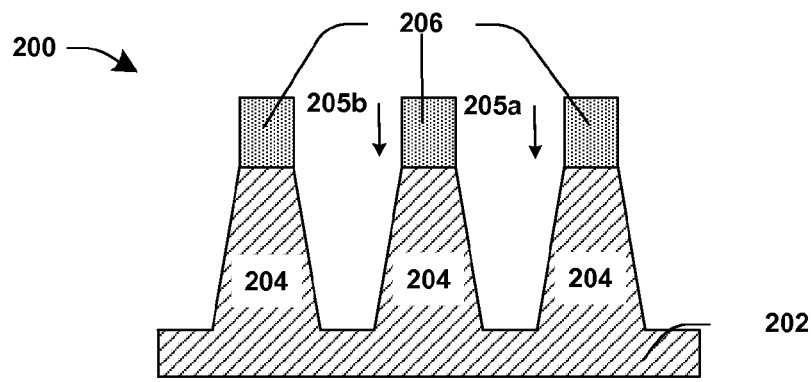
FIG. 4 is an illustration of a semiconductor arrangement, according to some embodiments.
Figure 5:
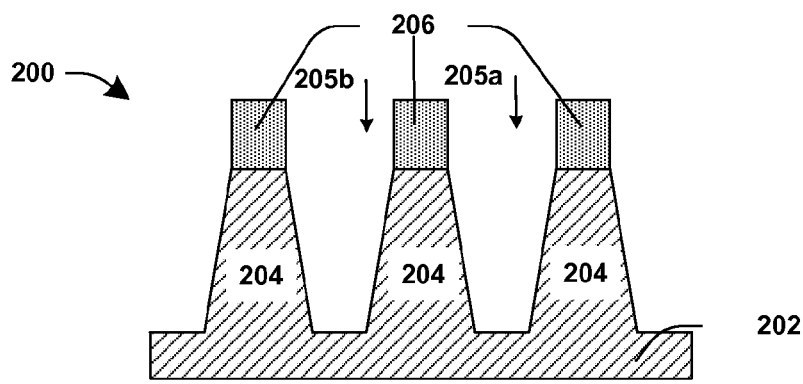
FIG. 5 is an illustration of a semiconductor arrangement, according to some embodiments.

At 102, a first trench 205a is formed in the substrate 202, as illustrated in FIGS. 3-5. In some embodiments, the substrate 202 comprises at least one of a silicon oxide or a silicon nitride. According to some embodiments, the substrate 202 comprises at least one of an epitaxial layer, a silicon-on-insulator (SOI) structure, a wafer, or a die formed from a wafer. In some embodiments, the first trench 205a is formed by patterning a first resist 206, such as a photoresist, over the substrate 202 and removing, such as by etching, portions of the substrate 202 not covered by the first resist 206. While the first trench 205a is discussed, other trenches such as 205b are formed as well, in some embodiments. Also, while trenches 205a and 205b are visible in FIGS. 4 and 5, the trenches 205a and 205b are not visible in FIG. 3 because FIG. 3 illustrates a cross section along line 250 of FIG. 2, where line 250 cuts through the OD region and the trenches are not formed in the OD region 204. The portion of the substrate 202 visible in FIG. 3 is thus covered by the first resist 206 in FIG. 3. In some embodiments, the patterned resist 206 is removed after the trenches 205 are formed.

Figure 6:
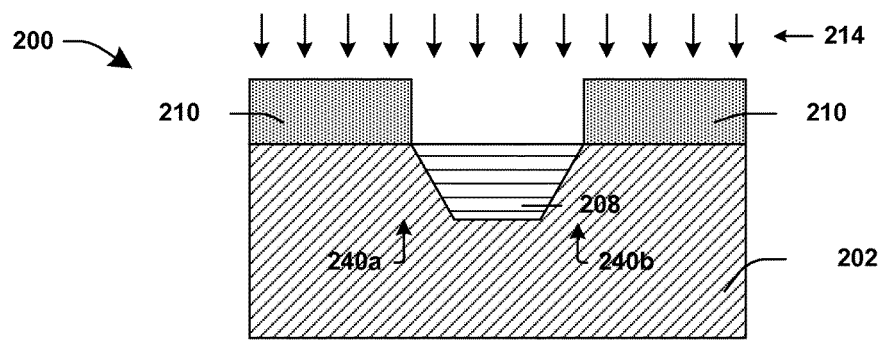
FIG. 6 is an illustration of a semiconductor arrangement, according to some embodiments.
Figure 7:
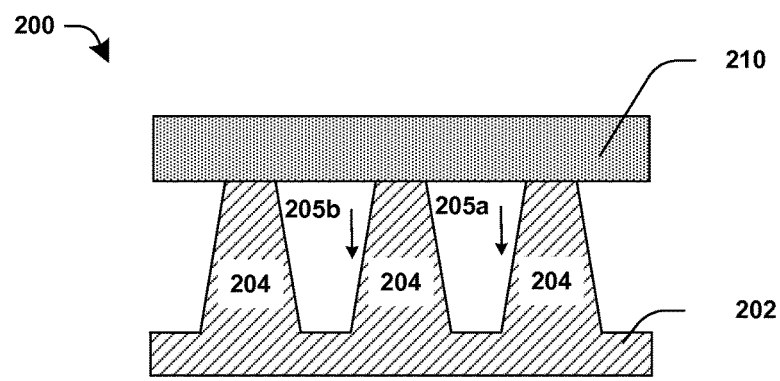
FIG. 7 is an illustration of a semiconductor arrangement, according to some embodiments.
Figure 8:
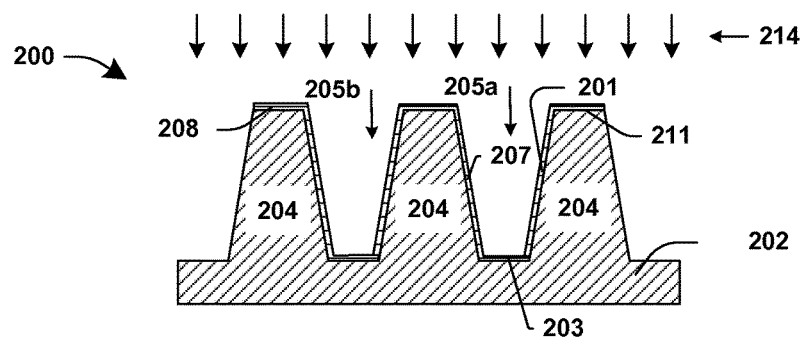
FIG. 8 is an illustration of a semiconductor arrangement, according to some embodiments.
Figure 9:
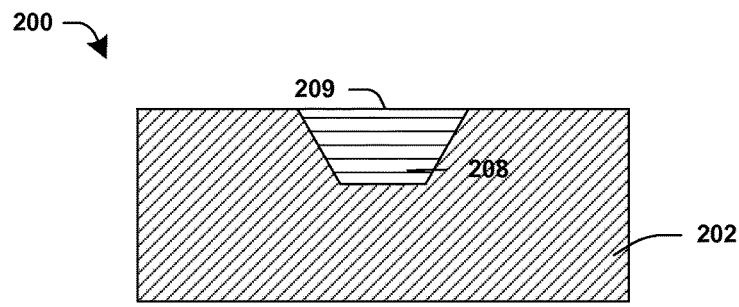
FIG. 9 is an illustration of a semiconductor arrangement, according to some embodiments.

At 104, a deep implant 208 is formed in the substrate 202, as illustrated in FIGS. 6-8. In some embodiments, the deep implant 208 is formed via deep implantation 214. In some embodiments, the deep implantation 214 comprises implanting a dose between about 1E03 atoms/cm$^2$ to about 1E07 atoms/cm$^2$ of a first dopant at an energy of between about 0.5 keV to about 4 keV. In some embodiments, the first dopant comprises at least one of nitrogen, phosphorus or arsenic. In some embodiments, the first dopant comprises at least one of boron, aluminum or gallium. In some embodiments, a second resist 210 is formed and patterned over the substrate 202 to a first side 240a and a second side 240b of a location where the deep implant 208 is to be formed, such that the deep implant 208 is merely formed within the substrate 202 at that location, as illustrated in FIG. 6. As illustrate in FIG. 7, the deep implant 208 is not formed in the substrate 202 in areas where gate structures 228 are to be formed and thus these areas of the substrate 202 are covered by the second resist 210. As illustrated in FIG. 8, the deep implant 208 is, however, in the substrate 202 on a first side 201 of the first trench, a bottom 203 of the first trench and a second side 207 of the first trench, as well as in similar areas in other trenches and on top surfaces 211 of the OD regions 204.

Figure 10:
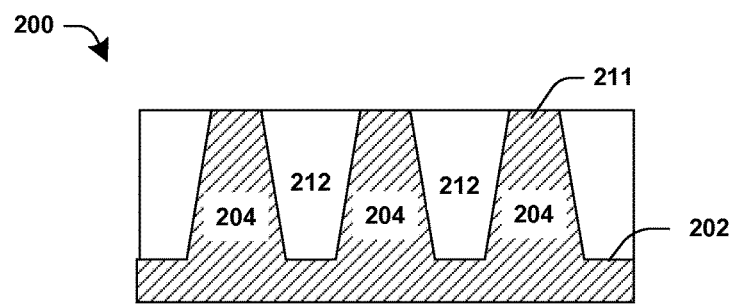
FIG. 10 is an illustration of a semiconductor arrangement, according to some embodiments.
Figure 11:
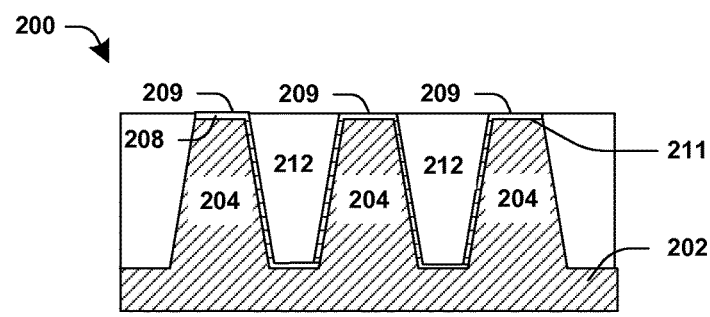
FIG. 11 is an illustration of a semiconductor arrangement, according to some embodiments.

At 106, a shallow trench isolation (STI) region 212 is formed over the deep implant 208 in the first trench 205a, as well as in other trenches, as illustrated in FIG. 11. As illustrated in FIG. 10, the STI region 212 is also formed in areas of the trenches 205 where the deep implant 208 is not formed. In some embodiments the STI region 212 is formed by filling the first trench 205a with a dielectric material, such as by deposition. In some embodiments, excess dielectric material is removed, such as by a chemical mechanic process (CMP), to form a substantially plainer surface. In some embodiments, a hard mask (not shown) is formed over the top surfaces 211 of the OD regions 204 to protect those surfaces 211 during such planarization processes.

Figure 12:
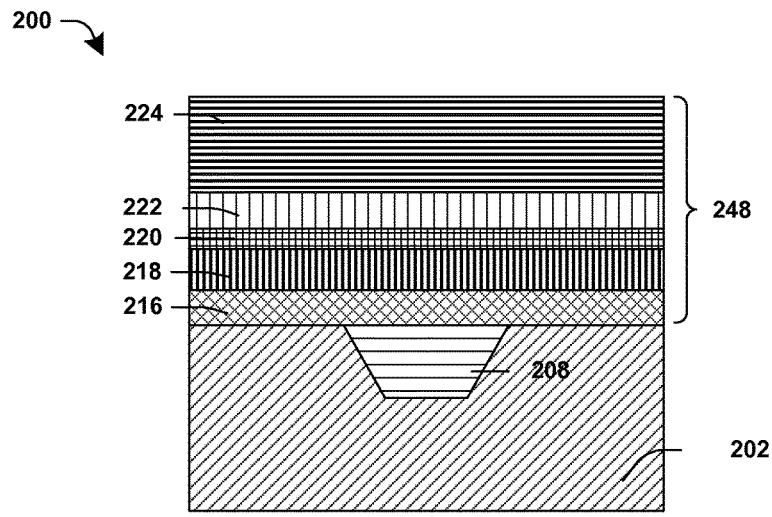
FIG. 12 is an illustration of a semiconductor arrangement, according to some embodiments.
Figure 13:
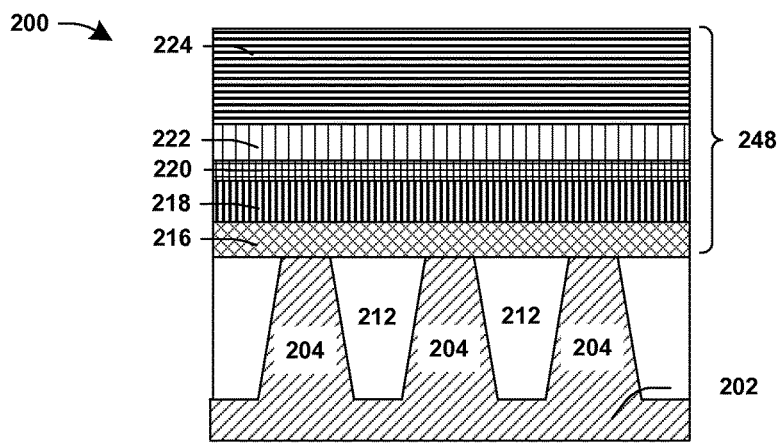
FIG. 13 is an illustration of a semiconductor arrangement, according to some embodiments.
Figure 14:
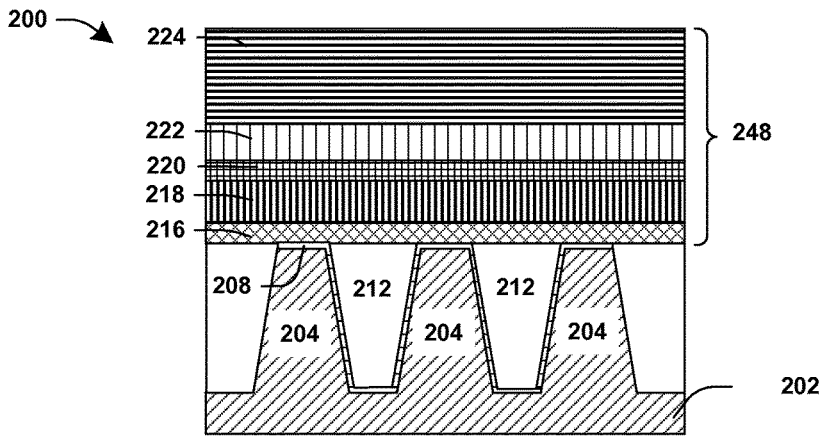
FIG. 14 is an illustration of a semiconductor arrangement, according to some embodiments.
Figure 15:
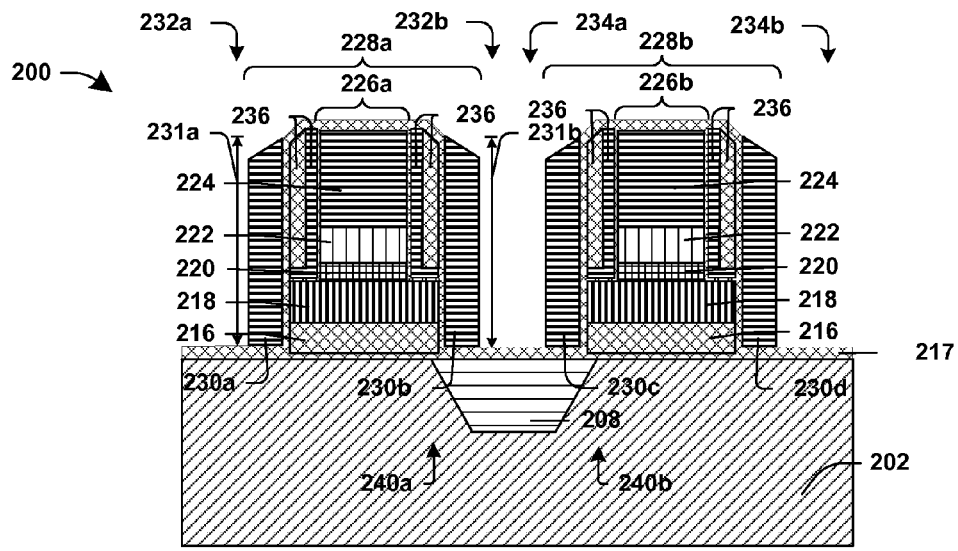
FIG. 15 is an illustration of a semiconductor arrangement, according to some embodiments.

At 108, as illustrated in FIGS. 2 and 15-17 a first gate structure 228a is formed on the first side 240a of the deep implant 208 and on a first side 238a of the STI region 212, a second gate structure 228b is formed on a second side 240b of the deep implant 208 and on the first side 238a of the STI region 212, a third gate structure 228c is formed on the first side 240a of the deep implant 208 and on a second side 238b of the STI region 212, and a fourth gate structure 228d is formed on the second side 240b of the deep implant 208 and the second side 238b of the STI region 212. According to some embodiments, additional gate structures, such as 228e, 228f, etc., are formed in a like manner. Turning to FIGS. 12-14, formation of such gate structures 228 comprises forming a gate material stack 248 over the substrate 202 and the STI regions 212, according to some embodiments. In some embodiments, the gate material stack 248 comprises a hard mask 224 formed over a control gate 222, the control gate 222 formed over a sandwich 220, the sandwich 220 formed over a floating gate 218, and the floating gate 218 formed over a gate oxide 216. In some embodiments, the gate oxide 216 comprises silicon oxide. In some embodiments, the gate oxide 216 has a height between about 50 Å to about 150 Å. In some embodiments, the gate oxide 216 is formed by deposition. In some embodiments, the floating gate 218 comprises at least one of a metal or a polysilicon. In some embodiments, the floating gate 218 has a height between about 150 Å to about 350 Å. In some embodiments, the floating gate 218 is formed by deposition. In some embodiments, the sandwich 220 comprises an oxide layer over a nitride layer over an oxide layer. In some embodiments, the sandwich 220 has a height between about 10 Å to about 100 Å. In some embodiments, the sandwich 220 is formed by deposition. In some embodiments, the control gate 222 comprises at least one of a metal or a polysilicon. In some embodiments, the control gate 222 has a height between about 150 Å to about 350 Å. In some embodiments, the control gate 222 is formed by deposition. In some embodiments, the hard mask 224 comprises at least one of silicon or nitride. In some embodiments, the hard mask 224 has a height between about 650 Å to about 950 Å. In some embodiments, the hard mask 224 is formed by deposition.

According to some embodiments, the gate material stack 248 is patterned to form the first gate structure 228a on the first side 240a of the deep implant 208 and on the first side 238a of the STI region 212, the second gate structure 228b on the second side of the deep implant 208 and on the first side 238a of the STI region 212, the third gate structure 228c on the first side 240a of the deep implant 208 and on the second side 238b of the STI region 212, and the fourth gate structure 228d on the second side of the deep implant 208 and the second side 238b of the STI region 212, as illustrated in FIGS. 2, 15-17. According to some embodiments, additional gate structures, such as 228e, 228f, etc., are formed in like manner. In some embodiments, the first gate structure 228a comprises a first gate 226a, a first sidewall spacer 230a, a second sidewall spacer 230b, and additional spacers 236 that are formed after one or more patterning actions are applied to at least some of the gate material stack 248. In some embodiments, the second gate structure 228b comprises a second gate 226b, a third sidewall spacer 230c, a fourth sidewall spacer 230d, and additional spacers 236 that are formed after one or more patterning actions are applied to at least some of the gate material stack 248. In some embodiments, the gate material stack 248 is patterned to form the first gate 226a and the second gate 226b. In some embodiments, the sandwich 220, the control gate 222 and the hard mask 224 are patterned to have a lesser width than the gate oxide 216 and the floating gate 218. In some embodiments, additional spacers 236 are formed on a first side 232a of the first gate 226a, and a second side 232b of the first gate 226a such that the additional spacers 236 are adjacent the sandwich 220, the control gate 222 and the hard mask 224. In some embodiments, the additional spacers 236 are formed on a first side 234a of the second gate 226b, and a second side 234b of the second gate 226b such that the additional spacers 236 are adjacent the sandwich 220, the control gate 222 and the hard mask 224. In some embodiments, the additional spacers 236 comprise at least one of oxide or nitride. In some embodiments, the first sidewall spacer 230a is formed on the first side 232a of the first gate 226a having a first sidewall height 231a and the second sidewall spacer 230b is formed on the second side 232b of the first gate 226a having a second sidewall height 231b. In some embodiments, the first sidewall height 231a is substantially equal to the second sidewall height 231b. In some embodiments, the second sidewall spacer 230b is at least partially over the deep implant 208. In some embodiments, a third sidewall spacer 230c is formed on the first side 234a of the second gate 226b and a fourth sidewall spacer 230d is formed on the second side 234b of the second gate 226b. In some embodiments, the third sidewall spacer 230c is at least partially over the deep implant 208. In some embodiments, a dielectric layer 217 is formed before the sidewall spacers 230a, 230b, 230c, 230d are formed. In some embodiments, the third gate structure 228c, the fourth gate structure 228d and additional gate structures, such as 228e, 228f, etc., are similarly arranged.

Figure 16:
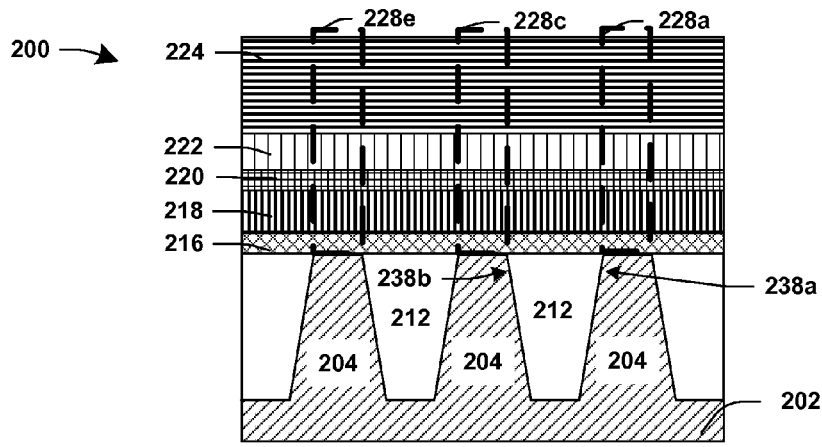
FIG. 16 is an illustration of a semiconductor arrangement, according to some embodiments.
Figure 17:
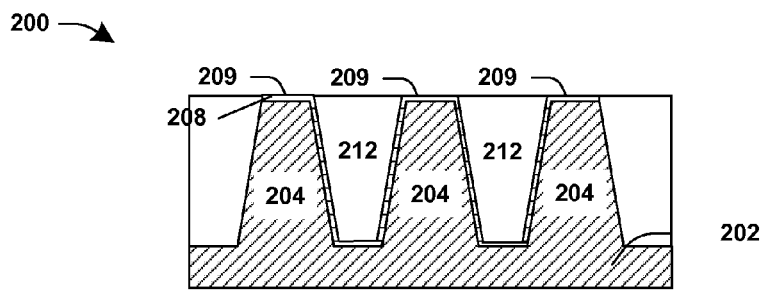
FIG. 17 is an illustration of a semiconductor arrangement, according to some embodiments.
Figure 18:
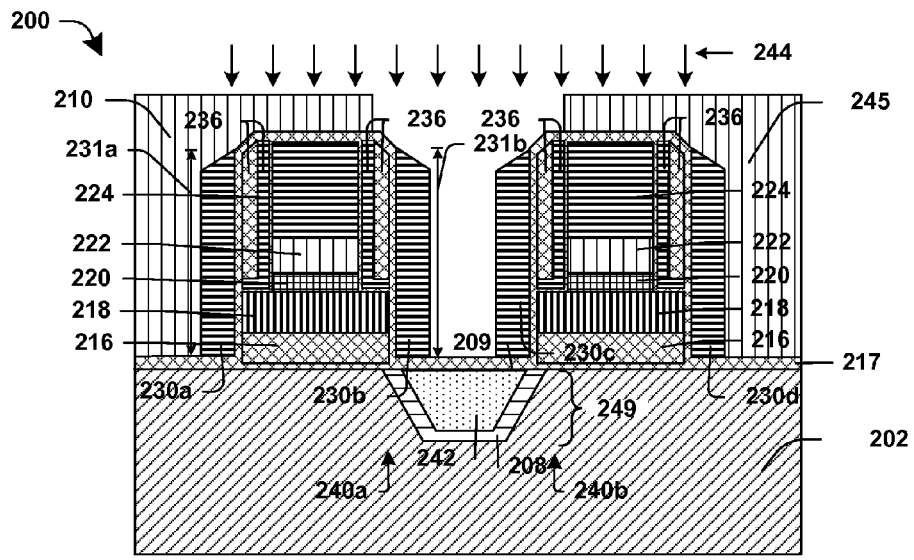
FIG. 18 is an illustration of a semiconductor arrangement, according to some embodiments.
Figure 19:
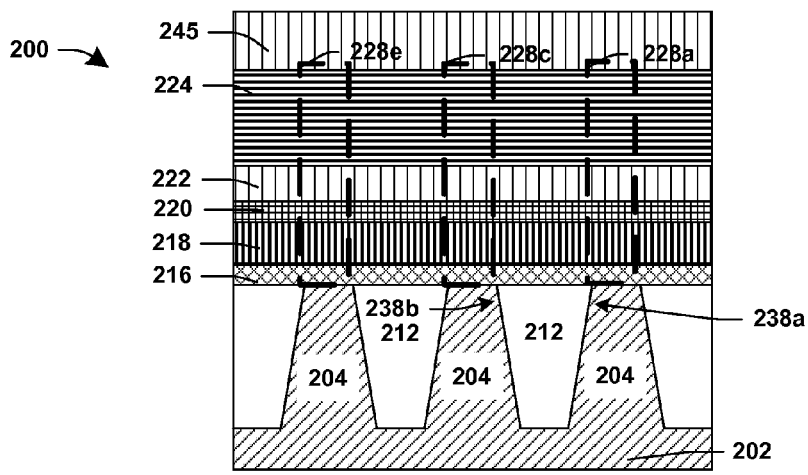
FIG. 19 is an illustration of a semiconductor arrangement, according to some embodiments.
Figure 20:
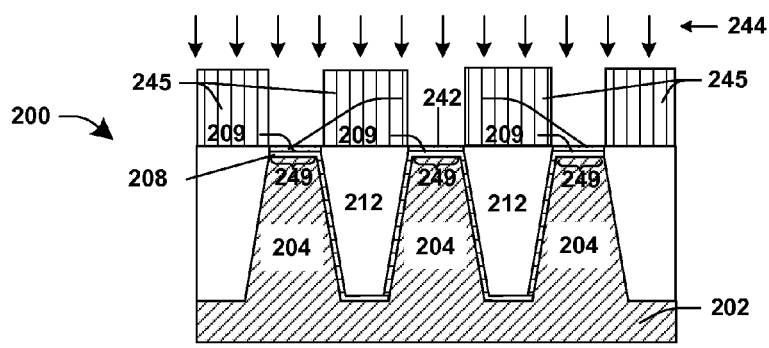
FIG. 20 is an illustration of a semiconductor arrangement, according to some embodiments.
Figure 21:
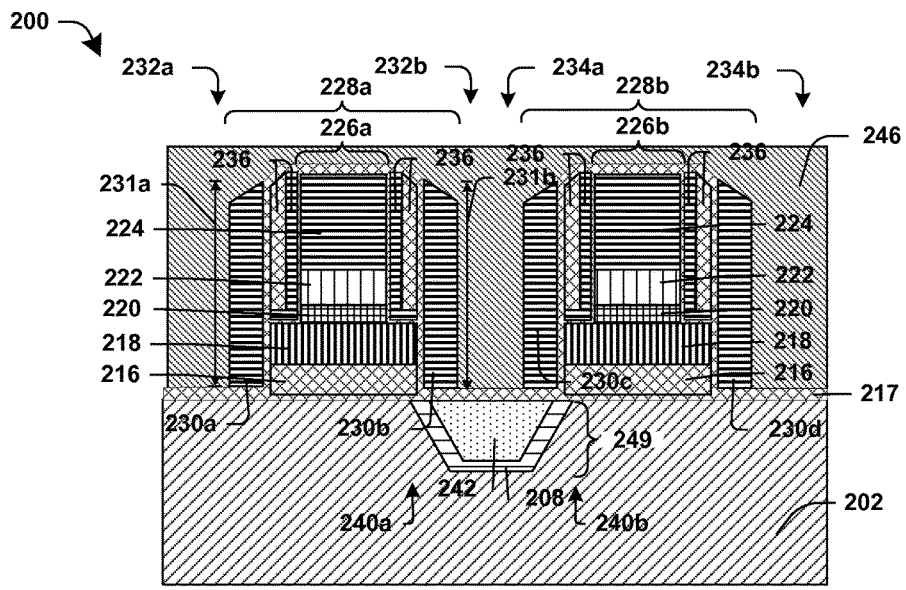
FIG. 21 is an illustration of a semiconductor arrangement, according to some embodiments.
Figure 22:
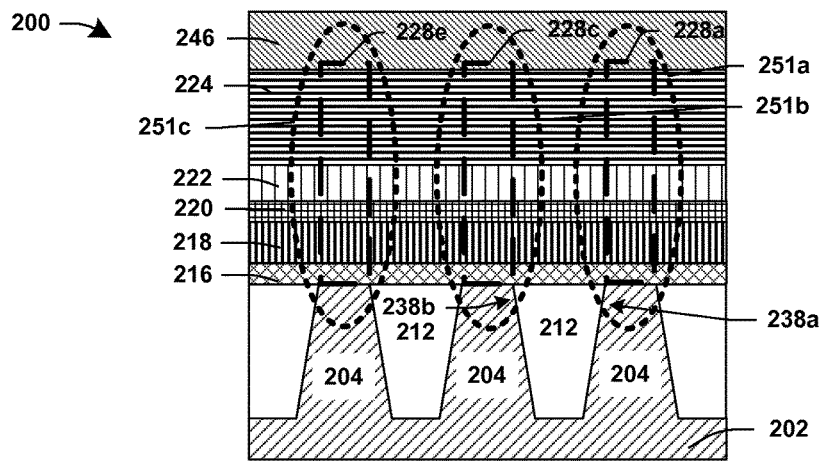
FIG. 22 is an illustration of a semiconductor arrangement, according to some embodiments.
Figure 23:
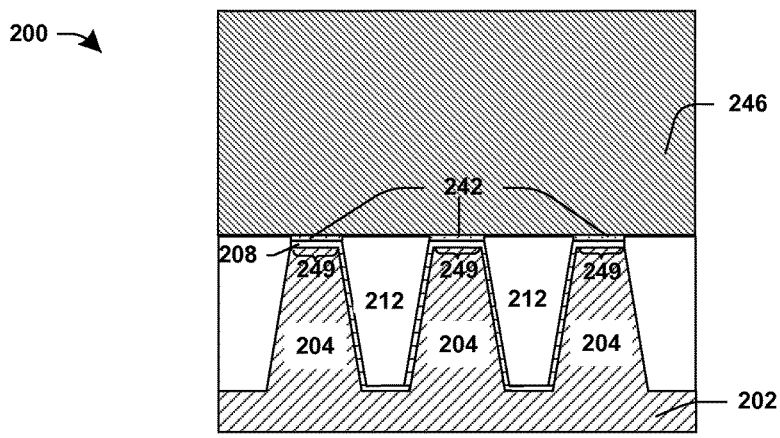
FIG. 23 is an illustration of a semiconductor arrangement, according to some embodiments.

At 110, a shallow implant 242 is formed in top portions 209 of the deep implant 208 that are exposed or not covered by STI 212, as illustrated in FIGS. 18-20. In some embodiments, the STI regions 212 are masked off such that the shallow implant 242 is implanted in the exposed deep implant 208 and not in the STI regions 212. In some embodiments, a second resist 245, such as a photoresist, is formed and patterned over at least part of the first gate structure 228a, the second gate structure 228b, additional gate structures, such as 228c, 228d, 228e, 228f, etc. and STI regions 212. In some embodiments, the shallow implant 242 is formed via shallow implantation 244. In some embodiments, the shallow implantation 244 comprises implanting a dose between about 1E05 atoms/cm$^2$ or less of a first dopant at an energy of between about 0.5 keV to about 4 keV. In some embodiments, the first dopant comprises at least one of nitrogen, phosphorus or arsenic. In some embodiments, the first dopant comprises at least one of boron, aluminum or gallium. In some embodiments, the active area 249 thus comprises the shallow implant 242 and the deep implant 208. In some embodiments, the active area 249 comprises at least one of a source or a drain for a gate structure 228. In some embodiments, at least the first gate structure 228a and the second gate structure 228b share the active area 249. According to some embodiments, the gate structures 228a, 228b, 228c, 228d, 228e, 228f, as well as zero or more additional gate structures share the active area 249, or at least the deep implant 208. According to some embodiments, a dielectric 246 is formed over the gate structures 228 and the STI regions 212. According to some embodiments, the gate structures 228 of resulting transistors 251 share materials of the gate material stack 248 as illustrated in FIGS. 16, 19 and 22. Materials of the gate material stack 248 are thus common among resulting transistors 251, where the transistors 251 are delineated from one another by STI regions 212 which separate OD regions 204 of the transistors 251 from one another. Thus, resulting transistors 251 have different OD regions 204 but common gate structure materials, where the OD regions 204 generally comprise source, drain and channel regions for respective transistors 251.

According to some embodiments, a method of forming a semiconductor arrangement comprises forming a deep implant in a substrate, forming a first gate structure on a first side of the deep implant, forming a second gate structure on a second side of the deep implant, such that the first gate structure and the second gate structure share the deep implant and forming a shallow implant in the deep implant to form an active area.

According to some embodiments, a semiconductor arrangement comprises an active area comprising a deep implant, a first gate structure on a first side of the active area and a second gate structure on a second side of the active area. In some embodiments, the first gate structure and the second gate structure share the active area. In some embodiments, the first gate structure comprises a first gate, a first spacer on a first side of the first gate and a second spacer on a second side of the first gate, the first spacer having a first spacer height and the second spacer having a second spacer height, the first spacer height substantially equal to the second spacer height.

According to some embodiments, a method of forming a semiconductor arrangement comprises forming a deep implant in a substrate, forming a first gate structure on a first side of the deep implant, forming a second gate structure on a second side of the deep implant, forming a third gate structure on the first side of the deep implant and forming a fourth gate structure on the second side of the deep implant such that the first gate structure, the second gate structure, the third gate structure and the fourth gate structure share the deep implant.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement comprising:
    forming a trench in a substrate;
    forming a first implant region in sidewalls of the substrate that define the trench, in a surface of the substrate that defines a bottom of the trench, and in a first portion of a top surface of the substrate;
    filling the trench with a dielectric after the first implant region is formed to define a shallow trench isolation (STI) region;
    forming, after the first implant region is formed, a first gate structure on a second portion of the top surface of the substrate;
    forming, after the first implant region is formed, a second gate structure on a third portion of the top surface of the substrate, wherein the first portion is between the second portion and the third portion; and
    forming a second implant region in the first portion of the top surface of the substrate, wherein the first implant region in the first portion of the top surface of the substrate and the second implant region define a source/drain region that is shared by the first gate structure and the second gate structure.

2. The method of claim 1, comprising:
    forming a gate material stack over the substrate after filling the trench with the dielectric, wherein forming the first gate structure comprises:
        patterning the gate material stack to remove a portion of the gate material stack overlying the first portion of the top surface of the substrate to form a first gate on the second portion of the top surface of the substrate.

3. The method of claim 2, wherein:
    forming the first gate structure comprises forming a first spacer on a first side of the first gate and forming a second spacer on a second side of the first gate, and
    the second spacer is over a portion of the first portion of the top surface of the substrate.

4. The method of claim 1, comprising:
    forming a gate material stack over the substrate after filling the trench with the dielectric, wherein forming the second gate structure comprises:
        patterning the gate material stack to remove a portion of the gate material stack overlying the first portion of the top surface of the substrate to form a second gate on the third portion of the top surface of the substrate.

5. The method of claim 4, wherein:
    forming the second gate structure comprises forming a third spacer on a first side of the second gate and forming a fourth spacer on a second side of the second gate, and
    the third spacer is over a portion of the first portion of the top surface of the substrate.

6. The method of claim 1, wherein forming the first implant region comprises implanting a dose between about 1E03 atoms/cm$^2$ to about 1E07 atoms/cm$^2$ of a first dopant at an energy of between about 0.5 keV to about 4 keV.

7. The method of claim 1, wherein forming the second implant region comprises implanting a dose between about 1E05 atoms/cm$^2$ or less of a first dopant at an energy of between about 0.5 keV to about 4 keV.

8. A method of forming a semiconductor arrangement comprising:
   forming a trench in a substrate;
   forming a first implant region in a first portion of a top surface of the substrate adjacent the trench;
   filling the trench with a dielectric after the first implant region is formed to define a shallow trench isolation (STI) region;
   forming a gate material stack over the substrate and over the first implant region, wherein the first implant region is covered by the gate material stack;
   patterning the gate material stack, wherein the patterning:
      removes a portion of the gate material stack overlying the first implant region;
      forms a first gate on a first side of the first implant region;
      forms a second gate on a second side of the first implant region;
      forms a third gate on the first side of the first implant region; and
      forms a fourth gate on the second side of the first implant region such that the first gate, the second gate, the third gate and the fourth gate share the first implant region; and
   forming a second implant region in the first implant region after patterning the gate material stack, wherein the STI region is masked while forming the second implant region to mitigate a dopant used while forming the second implant region from entering the STI region.

9. The method of claim 8, wherein the first implant region is further formed in sidewalls of the substrate that define the trench and in a surface of the substrate that defines a bottom of the trench.

10. The method of claim 8, comprising masking a portion of the substrate over which the first gate, the second gate, the third gate, and the fourth gate are formed prior to forming the first implant region.

11. The method of claim 8, comprising forming a dielectric material overlying the first gate and overlying the first implant region.

12. The method of claim 8, wherein the first implant region in the first portion of the top surface of the substrate and the second implant region define a source/drain region that is shared by the first gate and the second gate.

13. The method of claim 11, wherein the dielectric material is formed prior to forming the second implant region.

14. The method of claim 8, wherein forming the second implant region comprises implanting a dose between about 1E05 atoms/cm$^2$ or less of a first dopant at an energy of between about 0.5 keV to about 4 keV.

15. A method of forming a semiconductor arrangement comprising:
   implanting a first dopant into a substrate to form a first implant region;
   forming a gate material stack over the first implant region to cover the first implant region;
   patterning the gate material stack to remove a portion of the gate material stack overlying the first implant region and to form a first gate on a first side of the first implant region and a second gate on a second side of the first implant region; and
   implanting, after the patterning, a second dopant into a first portion of the first implant region to form a second implant region while a second portion of the first implant region is covered by a mask.

16. The method of claim 15, the second dopant different than the first dopant.

17. The method of claim 15, comprising, prior to the implanting a second dopant, forming a dielectric layer overlying the first gate and the first portion of the first implant region.

18. The method of claim 17, comprising, prior to the implanting a second dopant, forming a sidewall spacer over the dielectric layer and over a portion of the first portion of the first implant region.

19. The method of claim 15, comprising, prior to the implanting a second dopant, forming the mask over the second portion of the first implant region and the first gate.

20. The method of claim 15, comprising patterning the substrate to form a trench and the implanting a first dopant comprising:
   implanting the first dopant within a sidewall of the substrate that defines the trench, wherein the second portion of the first implant region corresponds to the sidewall.

* * * * *

UNITED STATES PATENT AND TRADEMARK OFFICE
CERTIFICATE OF CORRECTION

PATENT NO. : 9,673,194 B2  
APPLICATION NO. : 14/097516  
DATED : June 6, 2017  
INVENTOR(S) : Chuang et al.

Page 1 of 1

It is certified that error appears in the above-identified patent and that said Letters Patent is hereby corrected as shown below:

On the Title Page

In item (57) titled ABSTRACT, Line 7: Delete the word "arraignment" and replace with the word --arrangement--

In the Specification

Column 3, Line 6: Delete the word "arraignment" and replace with the word --arrangement--

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*